US006404579B1

United States Patent

(12) United States Patent
Ranmuthu et al.

(10) Patent No.: US 6,404,579 B1
(45) Date of Patent: Jun. 11, 2002

(54) CURRENT BIAS VOLTAGE SENSE SINGLE ENDED PREAMPLIFIER

(75) Inventors: Indumini Ranmuthu, Plano; Davy H Choi, Garland; Sami Kiriaki; Yong Han, both of Plano, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/699,009

(22) Filed: Oct. 27, 2000

Related U.S. Application Data

(60) Provisional application No. 60/167,548, filed on Nov. 23, 1999.

(51) Int. Cl.[7] .................................................. G11B 5/03

(52) U.S. Cl. ............................................ 360/66; 360/67

(58) Field of Search .............................. 360/66, 46, 67, 360/53, 65, 313; 330/261, 267, 127, 129; 327/108, 110, 310, 311, 553, 554, 530, 538, 540, 541, 542, 543

(56) References Cited

U.S. PATENT DOCUMENTS 6,066,987 A * 5/2000 Lorenz ....................... 330/311

* cited by examiner

*Primary Examiner*—Alan T. Faber
(74) *Attorney, Agent, or Firm*—W. Daniel Swayze, Jr.; W. James Brady; Frederick J. Telecky, Jr.

(57) ABSTRACT

Preamplifiers are used in hard disk drive applications to read data stored on magnetic disk. Current bias current sense preamplifiers have a problem with bandwidth rolloff due to relatively high inductance. Voltage sense preamplifiers have a problem with peaking due to input capacitance. An improved current bias voltage sense preamplifier inserts a PMOS transistor M3 between the Rmr head and the bipolar transistor Q0. The PMOS transistor M3 and the bipolar transistor Q0 form a high impedance voltage sense preamplifier. Biasing of the MR head is performed transistors M6 and M7 that mirror the current supplied by the current digital to analog converter into the MR head. Hence, the preamplifier is also of the current bias type. Peaking is controlled through a programmable current in an input capacitance cancellation circuit 30.

4 Claims, 3 Drawing Sheets

*FIG. 1*
*(PRIOR ART)*
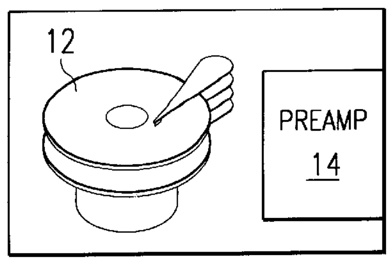
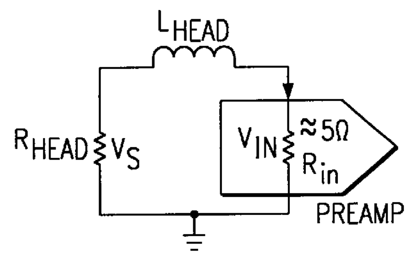
*FIG. 2*
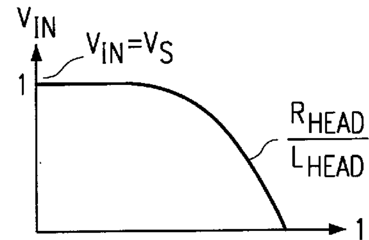
*FIG. 2a*
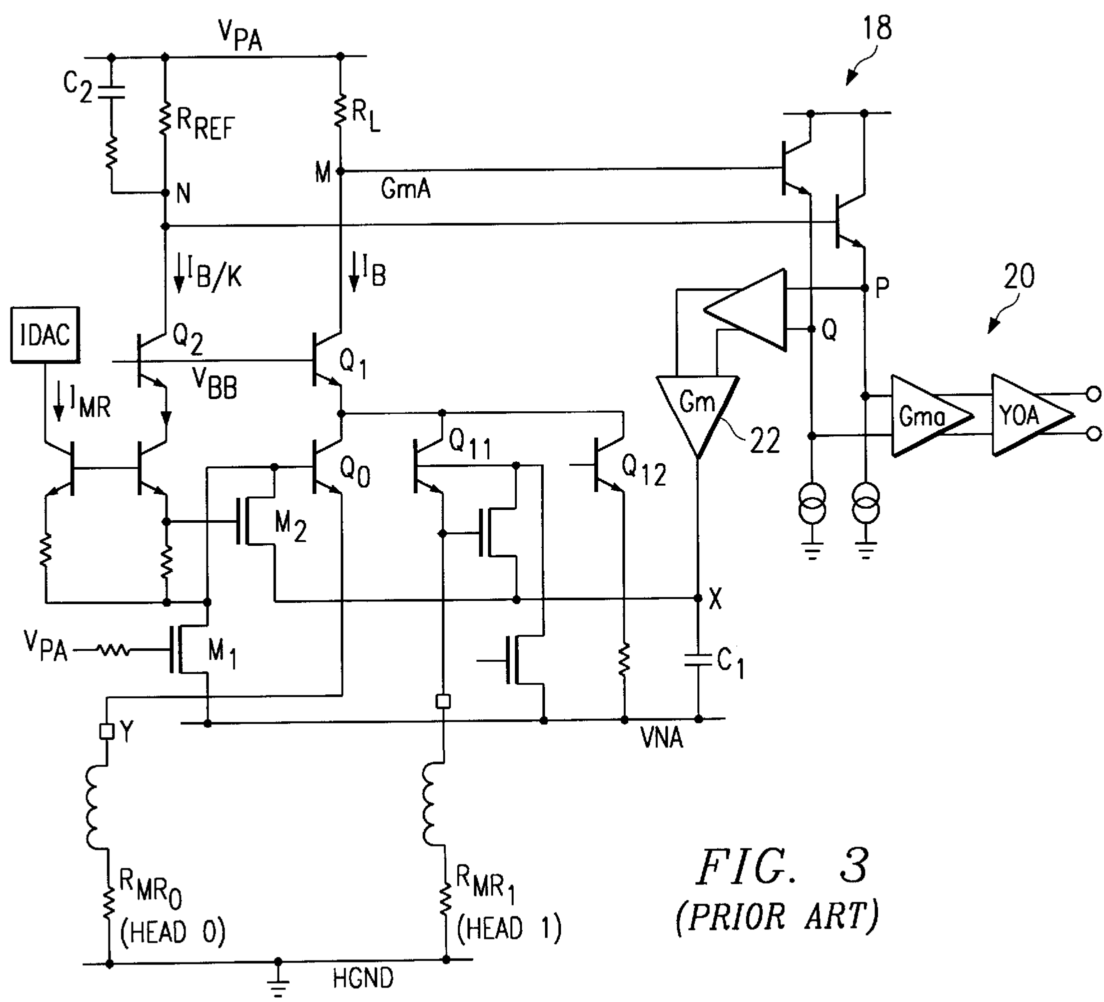
*FIG. 3*
*(PRIOR ART)*

CURRENT BIAS VOLTAGE SENSE SINGLE ENDED PREAMPLIFIER

This application claims priority under 35 USC §119 (e) (1) of Provisional Application No. 60/167,548, filed Nov. 23, 1999.

FIELD OF THE INVENTION

The invention relates generally to the field of information storage, more specifically to hard disk drives and in particular to preamplifier circuits.

BACKGROUND OF THE INVENTION

U.S. Pat. No. 5,831,888 entitled "Automatic Gain Control Circuit" and assigned to Texas Instruments Incorporated, the assignee of the present invention, sets forth generally the description of disk storage. Hard disk drives (HDD) are one type of disk storage that are particularly used in personal computers today. The HDD device generally includes a magnetic storage media, such as rotating disks or platters, a spindle motor, read/write heads, an actuator, a preamplifier, a read channel, a write channel, a servocontroller, a memory and control circuitry to control the operation of the HDD and to properly interface the HDD to a host or system bus. The following U.S. Patents describe various aspects of HDD devices:

| | | |
|---|---|---|
| 5,535,067 | Frequency Controlled Reference Generator | Issued 07/09/96 |
| 5,570,241 | Single Channel, Multiple Head Servo . . . | 10/29/96 |
| 5,862,005 | Synchronous Detection Of Wide BI-Phase . . . | 01/19/99 |
| 5,793,559 | In Drive Correction Of Servo Pattern . . . | 08/11/98 |
| 5,719,719 | Magnetic Disk Drive With Sensing . . . | 02/17/98 |
| 5,444,583 | Disk Drive Having On-Board Triggered . . . | 08/22/95 |
| 5,448,433 | Disk Drive Information Storage Device . . . | 09/05/95 |
| 5,208,556 | Phase Lock Loop For Sector Servo System | 05/04/93 |
| 5,642,244 | Method and Apparatus For Switching . . . | 06/24/97 |

Prior art FIG. 1 illustrates a disk/head assembly 12 and a preamplifier 14. The preamplifier 14 handles both read functions and write functions. Not illustrated in FIG. 1, for clarity, is the Magentoresistive (MR) head. The unshown MR head works through magnetic media and it has both functions, read and write, with a different portion of the head performing each function. The write function portion of the MR head is inductive and the read function portion of the head acts as a magnetic resistive element. A write occurs through an inductive element to the magnetic media disk assembly 12 and a read occurs by sensing the magnetic shifts in the disk assembly 12 by using the resistive read element. The preamplifier 14 connects to the unshown MR head.

The preamplifier 14 typically is a multistage preamplifier having an initial amplification stage, a middle amplification stage and a final amplification stage. The initial amplification stage is usually of the single ended variety as opposed to the middle amplification stage which is usually of the differential variety. The single ended variety is particularly advantageous in hard disk drive applications as one input to the preamplifier is the MR head input and the other input is ground. Effectively, therefore, it has only one input, the MR head input, and so it is referred to as single ended. Two types of single ended initial amplification stages exists: current bias current sense design systems; and, voltage sense design systems.

FIG. 2 illustrates a prior art current bias current sense preamplifier such as suitable for preamplifier 14 of prior art FIG. 1. Current bias means that the preamplifier sends a constant current through the MR head. Current sense means that when the MR head moves over data stored on the disk/head assembly 12, the input signal to the MR head is a current signal. The input signal is thus indicative of a current change in the head. (In a voltage sense preamplifier, the input signal is a voltage signal as opposed to a current signal.) In FIG. 2, Rhead is a resistor that represents is the MR head. Lhead is a wire that goes from the preamplifier to the MR head and is represented as an inductor. The triangular figure represents the preamplifier. One input to the preamplifier is the MR head input and the other input to the preamplifier is ground. Since it is a current sense preamplifier, by definition it has a very low input impedance (which in this case, is about 5 ohms).

Prior art FIG. 3 illustrates a portion of the read channel of the current bias current sense preamplifier 14 of FIG. 2. The resistive portion of the MR head is represented by the resistor Rmr. Rmr0 represents head 0 and Rmr1 represents head 1. In typical mass storage devices of the HDD type, the preamplifier 14 may have as many as 1 to 8 channels. An initial amplification stage 18 of preamplifier 14 connects to the resistive portion Rmr of the MR head. Later gain stages 20 of preamplifier 14 are connected to the outputs of initial amplification stage 18 at nodes P and Q. The read path outputs flow from the later gain stages 20. Amplifier Rma is the read channel middle amplifier and amplifier Roa is the read channel output amplifier. Both amplifiers are of the differential type. The head selection is performed on preamplifier 14 from an unillustrated head select logic stage. Transistor M2 represents the read channel input enabling MOS transistor for head 0.

In FIG. 3, the architecture of initial amplification stage 18 of preamplifier 14 is constructed as that of a single ended amplifier as opposed to a differential amplifier. On the RL load side of the single ended amplifier, the bias current Ib travels through the load resistor RL and through the collector of transistor Q1 to set the voltage on node M. On the constant voltage side of the single ended amplifier, the bias current Ib/k (k is a scaling constant) travels through the scaling reference resistor Ref to set the voltage on node N. In hard disk drives, during a read operation, the current in the read head (represented by Imr) is biased up to a certain level, which is typically around 2—8 mA. This bias current Imr is established through a feedback loop created by transconductance amplifier 22 across nodes M and N whose output is connected to the base of the input transistor Q0 through MOS switch M2. This, in essence, creates a pseudo-balanced output on the reader load resistors such as would exist if a differential amplifier were used in the initial amplification stage 18 as dc nodes M & N will be at the same potential. Since the head resistance Rmr0 is connected to transistor Q0, the impedance looking from Rmr into transistor Q0 is very small because it is looking into the emitter of the bipolar transistor Q0. (Emitter impedance is low for bipolar transistors - - - only a few ohms.) A problem, however, with low impedance is bandwidth rolloff as will be explained later below.

In operation of prior art FIG. 3, when head 0 is selected by unillustrated head select logic circuitry (which establishes a current Imr on the gate of MOS transistor M2) NPN bipolar transistors Q0 and Q1 are on. Together with the load resistor RL, they form a cascode amplifier. A cascode amplifier is a high bandwidth amplifier. The transistor Q0 is a common base amplifier and the transistor Q1 acts as a common base amplifier. As the magnetic resistive head moves over data, the head resistance Rmr varies. This can be modeled by an alternating current ac signal in series with the Rmr resistor. The transistors Q0 and Q1 amplify this signal. The ac signal goes to the load resistor RL and produces an ac signal at node M which is the input of latter gain stage 20 that is a differential amplifier. The other input of the amplifier 20 is node N that should be at a dc bias voltage equal to the voltage on the load resistor RL node M. The node N, which is the constant voltage side of the later gain stage amplifier 20, should not have an alternating current signal on it. The transconductance amplifier 22 and the capacitor C1 form a feedback loop with the cascode amplifier Q0 and Q1. The purpose of the loop is to make sure that node M dc voltage on the signal side of the load resistor RL is the same as the dc voltage on node N. If the dc voltage on node M and node N are the same, the input voltages on differential amplifier 20 are the same. On node N, there is no ac signal; on node M there is an ac signal. If the dc voltages are equal, then the differential later gain stage amplifier 20 will amplify the ac signal and send it to further gain stages.

FIG. 2*a* is a gain bandwidth plot for the signal at the input of the current bias current sense preamplifier 14 of FIGS. 2 and 3. At low frequencies, all the source frequencies, Vs, that go through the MR head appear on the preamplifier, Vin. As the frequencies increase, the head connection wire has an inductance Lhead that poses a large impedance. The frequency response thus mimicks a low pass filter and the 3 db corner frequency is effectively given by Rhead/Lhead.

For MR heads that have large inductances, or, for MR heads that have small resistances, the frequency response of the current bias current sense preamplifier is poor due to the lower 3 db corner frequency. This presents a problem because a recent trend in design is to have a large inductance for the wire trace going out to the MR head. Trace suspension assembly is one such favored technique employing large inductance. Further, the resistance in the MR head is decreasing. These lower levels effectively move the 3 db corner frequency of FIG. 2*a* in. So, while a current bias current sense preamplifier may have a very high bandwidth, if the input signal itself gets rolled off, the system bandwidth becomes low. Thus, for a high data rate disk drive system, not very much signal may be output from the current bias current sense preamplifier design.

One way to get rid of this frequency rolloff limitation is to make the input impedance Rin of the preamplifier very high. However, by default (because of the nature of the emitter impedance), a current bias current sense preamplifier cannot have very large impedance. If a high input impedance is required, the solution is to use a voltage sense preamplifier design. FIG. 4 depicts a voltage sense preamplifier and FIG. 4*a* is a gain bandwidth frequency plot for an ideal voltage sense preamplifier. When a very high input impedance exists, all of the signal that is on the MR head appears on the preamplifier regardless of the frequency. As such, the signal into the preamplifier does not decrease with frequency. Also, bandwidth does not depend on the resistance of the MR head. Thus, a voltage sense preamplifier appears to provide a good solution. How to accomplish it is, however, quite another matter because, in reality, the high input impedance of the voltage bias voltage sense preamplifier tends to be of a capacitive nature. As such, in FIG. 4, a capacitor is illustrated in the preamplifier instead of a resistor. This capacitance, together with the inductance Lhead in the assembly wire, unfortunately tends to introduce a peak in the frequency response as illustrated in FIG. 4*b*. This peak arises because of the resonance between Lhead and Cin. Peaking presents a problem of group delay to the read channel.

It is accordingly an object of the invention to provide a preamplifier having a high impedance without the peaking commonly associated with voltage sense preamplifiers.

Other objects and advantages of the invention will be apparent to those of ordinary skill in the art having the benefit of the description herein.

SUMMARY OF THE INVENTION

An inventive current bias voltage sense single ended preamplifier incorporates a PMOS transistor between the MR head and the input bipolar transistor to increase impedance on the input and increase bandwidth. A MR biasing circuit may be provided to provide a bias current for the MR head. The PMOS transistor and the input bipolar transistor sense a change in voltage signal on the MR head. An input capacitance cancellation circuit, whose amount of cancellation is variable, may be added to reduce the input capacitance and thereby control peaking.

BRIEF DESCRIPTION OF THE DRAWINGS

FIG. 1 is a prior art drawing illustrating a disk/head assembly and a preamplifier of a typical HDD device.

FIG. 2 is a prior art drawing illustrating a current bias current sense preamplifier suitable for the preamplifier of FIG. 1.

FIG. 2*a* is a gain banded plot for the current bias current sense preamplifier of FIG. 2.

FIG. 3 is a schematic drawing illustrating the initial amplification stage of the current bias current sense preamplifier of FIG. 2.

DETAILED DESCRIPTION OF PREFERRED EMBODIMENT

Figure 4:
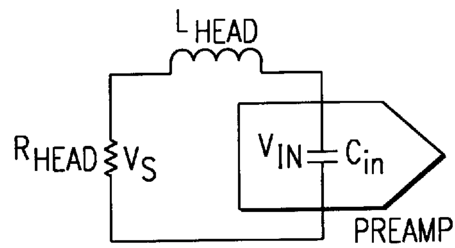
FIG. 4 is a prior art drawing illustrating a voltage sense preamplifier suitable for the preamplifier of FIG. 1.
Figure 4A:
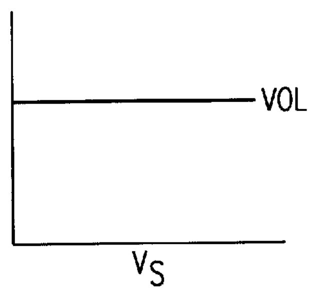
FIG. 4*a* is a gain banded plot of the ideal frequency response of the voltage sense preamplifier of FIG. 4.
Figure 4B:
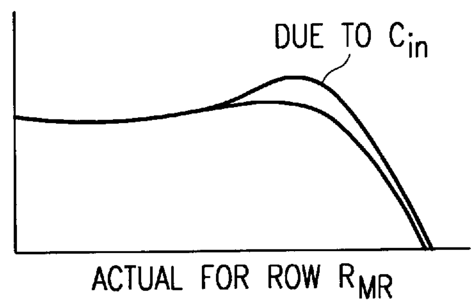
FIG. 4*b* is a gain banded plot of the actual frequency response of the voltage sense preamplifier of FIG. 4.
Figure 5B:
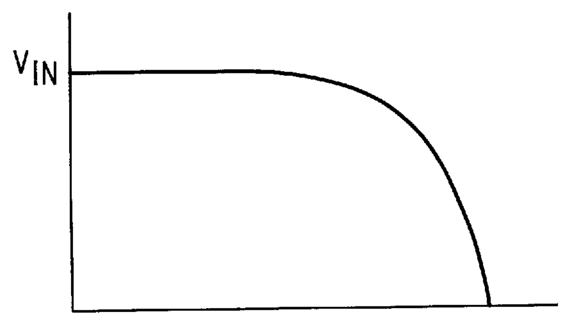
FIG. 5*b* is a gain banded plot of the frequency response of the current bias voltage sense preamplifier of FIG. 5.
Figure 5A:
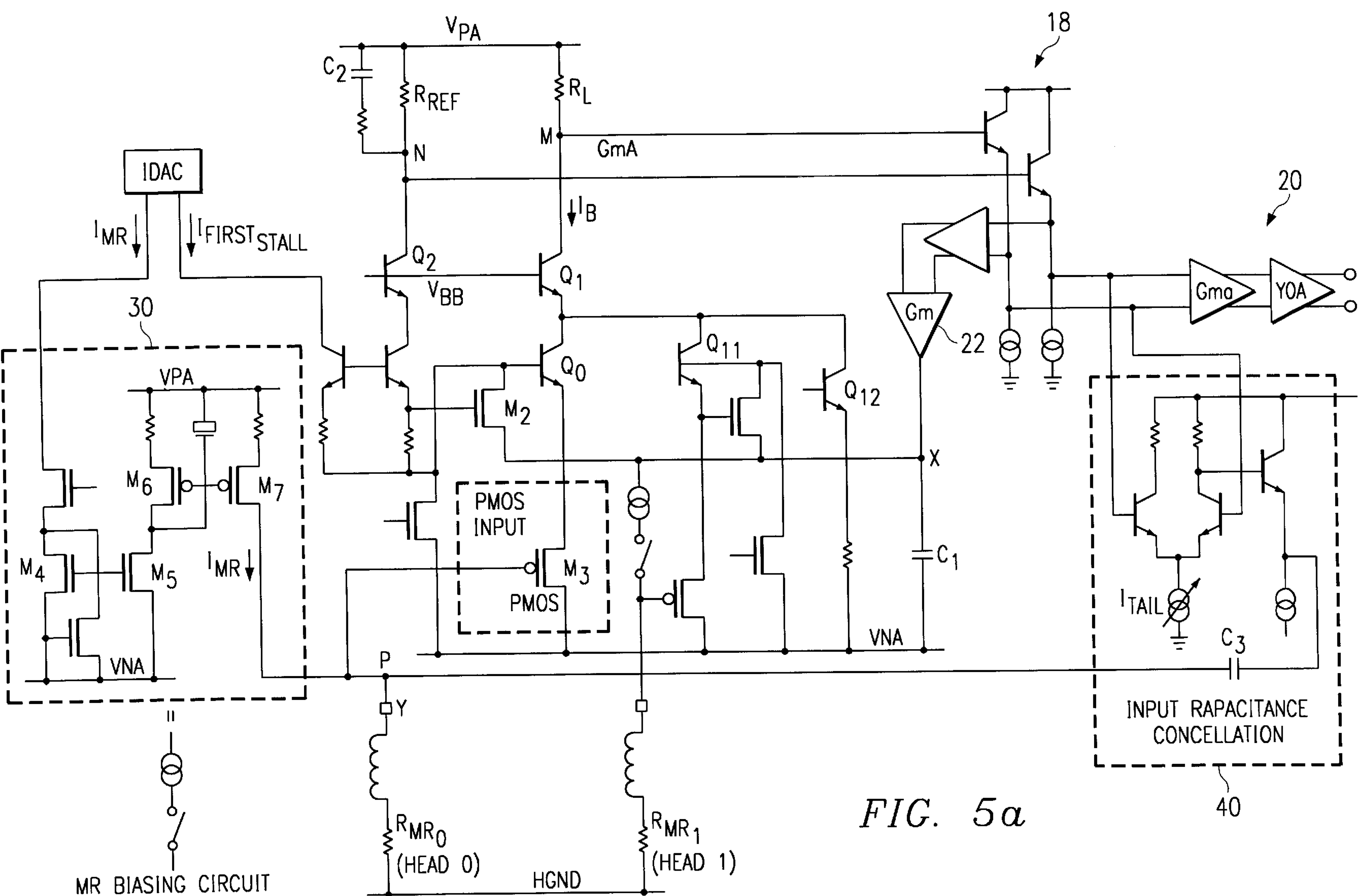
FIG. 5*a* is a schematic drawing, illustrating the preferred embodiment of the initial amplification stage of a current bias voltage sense preamplifier.

FIG. 5*a* illustrates the initial amplification stage of a current bias voltage sense preamplifier according to a preferred embodiment of the invention. By comparing FIG. 5*a* to prior art FIG. 3, details of the invention become apparent as like reference numerals are used in the figures.

Recall that in the current bias current sense preamplifier of FIG. 3, the bipolar transistor Q0 is the input transistor for head 0. Its emitter is connected to the MR head 0. The collector of transistor Q0 is connected to the cascode bipolar transistor Q1. Together with load resistor RL, this forms the first stage. The current through the head resistor Rmr was set by the reference side consisting of transistor Q2 and the read DAC. The common mode voltage between node N and node M was maintained by having a GM C1 loop. The GM C1 loop ensures that nodes M and N are at the same potential. The impedance looking, from Rmr into transistor Q0 was very small because it was looking, into the emitter of the bipolar transistor Q0. Emitter impedance is low for bipolar transistors, only a few ohms such as around 5 ohms. A problem with low impedance input, however, is bandwidth rolloff.

The inventive current bias voltage sense preamplifier of FIG. 5*a* inserts a p-channel metal oxide PMOS transistor between the input bipolar transistor Q0 and the Rmr head. For head 0, the PMOS transistor M3 is inserted at the emitter of the input transistor Q0. (Likewise for head 1 and for all the other unillustrated heads, a PMOS transistor would be inserted between the input bipolar transistors and the Rmr heads.) The gate of the PMOS transistor M3 is connected to the Rmr head at node P. By doing so, the gate of the MOSFET transistor M3 together with the base of bipolar transistor Q0 forms an amplifier. The Q0 base is capacitively coupled to ground by capacitor C1. In this arrangement, the MOSFET transistor M3 receives the input signal from the Rmr head. The input signal gets gained up when it travels through M3, Q0 and the load resistor R1. The gain is equal to the Gm of transistor Q0 and M1 together times the R1 resistance. This is the first stage gain.

In FIG. 5*a*, since the PMOS transistor M3 is amplifying the input signal and the gate of a MOSFET has very high impedance, effectively, a high impedance input is created which will sense voltage. The high impedance input node P of MOSFET transistor M3 is connected to the Rmr head. So, any voltage signal on Rmr goes to MOSFET M3 gate and is further amplified. Hence, the preamplifier of FIG. 5*a* is a voltage sense amplifier. Now, the Rmr head needs a bias. A MR biasing circuit 30 provides a constant current bias for the Rmr head. The MR biasing circuit 30 is actually a current mirror. The IMR current from the digital to analog converter current source Idac, is mirrored by MOSFETs M4 and M5. It is again mirrored by MOSFETs M6 and M7 where it goes into the Rmr head. Looking into transistor M7 from node P, a high impedance exists. Therefore, the input impedance of the preamplifier is still high, but at the same time, it receives a constant current. This makes the preamplifier a current bias one, and, since the input from the MR head to MOSFET transistor M3 is a voltage, it makes the preamplifier a voltage sense one.

In FIG. 5*a*, after the first stage of the preamplifier amplifies the input signal, the rest of the loop operates the same as that of FIG. 3. Nodes M and N have to be made equal because of the common mode. A common dc difference of zero between the two nodes is needed when going into the subsequent amplification stages 20 Rma and Roa. Nodes M and N are maintained at the same voltage by having a GM C1 loop. Thus, the base of transistor Q0 gets biased up so that nodes M and N always remain at the same voltage.

Now, the PMOS transistor must be sized appropriately so that a minimal amount of noise is introduced into the circuit. If the transistor is too small, the noise goes up. If the transistor is too large, the capacitance on the PMOS becomes prominent and the peaking (as illustrated in FIG. 3) becomes an issue.

The preferred embodiment illustrated in FIG. 5*a*, has an input capacitance cancellation circuit 40 to control peaking. As previously discussed in the Background of the Invention, because of the capacitive nature of a voltage sense preamplifier, at very high Rmr values, (such as around 70 to 80 ohms), the capacitance tends to act as a short at high frequencies and the signal rolls off. Thus, effectively, a frequency pole is introduced into the circuit which begins to rolloff the signal and tends to defeat the purpose of using the voltage sense preamplifier for large Rmr. To eliminate this problem, the circuit of FIG. 5*a* advantageously utilizes an input capacitance cancellation circuit 40 that reduces the input capacitance of the PMOS transistor M3. The input cancellation circuit 40 is effectively a differential amplifier connected across later gain stage 20 with a variable current source Itail. The circuit takes the signal input at later gain stage 20 Rma amplifier and gains it up and feeds it back through a capacitor C3 to the PMOS input. The effect is a small amount positive feedback that cancels the input capacitance of the PMOS transistor. So, instead of the MR head supplying any current to charge the gate capacitance of the PMOS transistor M3, the input cancellation circuit does so. Thus, the head does not supply any capacitive current and does not, therefore, see any capacitance. For different values of heads, different amounts of input capacitance cancellation is needed. Changing the current source Itail in the differential amplifier varies the gain of the cancellation circuit and thus varies the amount of cancellation. A higher gain cancels more capacitance and a lower gain cancels less capacitance. The cancellation factor is thus changed by varying the amount of the current Itail. For low values of Rmr (such as around 20—20 ohms) peaking exists in the frequency response due to the resonance of Lhead and M3 input capacitance. An extra pole is placed in the Rma gain stage to remove this peaking.

In overall summary, current bias current sense single ended preamplifiers have been used in hard disk drives. A problem with such preamplifiers is that low head resistance Rmr and high inductance reduces the bandwidth of the preamplifier at the initial input amplification stage. Utilizing a voltage sense single ended preamplifier solves the bandwidth problem, but voltage sense preamplifiers have a problem with input capacitance which gives rise to undesireable peaking in low Rmr cases. The invention employs a current bias voltage sense single ended preamplifier. A PMOS transistor is inserted at the head input as illustrated in FIG. 5*a*. The PMOS transistor M3 together with the bipolar transistor Q0 form an amplifier whose signal is fed to the MR head. The amplifier has a high impedance input and thus becomes voltage sense. The bias current of bipolar transistors Q0 and Q0 is maintained by the GM C1 loop and it works like the current sense design of the prior art FIG. 3. The biasing of the head Rmr is done by current mirror transistors M6 and M7 which take the I DAC bias current IMR and mirrors it around into the Rmr. The mirror poses a high input impedance when looking through the Rmr. Thus, the whole system is one with high input impedance. To reduce the peaking for low Rmr cases, bandwidth reduction is utilized by having an extra programmable pole in the Rma gain stage.. And, in the case of high Rmr, an input capacitance cancellation circuit 30 is utilized to extend the bandwidth of the system.

While the invention has been particularly shown and described by the foregoing detailed description, it will be understood by those skilled in the art that various other changes in form and detail may be made without departing from the spirit and scope of the invention as defined by the following claims.

What is claimed is:

1. A preamplifier circuit for a magnetoresistive head, comprising:

a load side having a load resistor coupled to a first bipolar transistor, the first bipolar transistor having its emitter connected to an initial bipolar transistor;

a reference side coupled to said load side having a reference resistor connected to a second bipolar transistor; and a p-channel metal oxide semiconductor transistor connected between the initial bipolar transistor and the magnetoresistive head, wherein the p-channel metal oxide semiconductor transistor has its gate connected to the magnetoresistive head and a source/drain terminal connected to the initial bipolar transistor.

2. The preamplifier circuit of claim 1 further comprising a current mirror connected to the magnetoresistive head to provide a bias current for the magnetoresistive head.

3. The preamplifier circuit of claim 2 further comprising an input capacitance cancellation circuit coupled across the load side and the reference side and coupled to the gate of the p-channel metal oxide semiconductor transistor.

4. The preamplifier circuit of claim 3 wherein the input capacitance cancellation circuit includes a programmable current source to vary the gain of the input capacitance cancellation circuit and thereby vary the amount of capacitance cancelled.

* * * * *